(12) United States Patent
Groot

(10) Patent No.: US 6,908,315 B2
(45) Date of Patent: Jun. 21, 2005

(54) SOCKET FOR TESTING A COMPONENT AND METHOD OF TESTING A COMPONENT

(75) Inventor: Erik Harold Groot, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 376 days.

(21) Appl. No.: 10/181,084

(22) PCT Filed: Nov. 14, 2001

(86) PCT No.: PCT/EP01/13263
§ 371 (c)(1),
(2), (4) Date: Jul. 12, 2002

(87) PCT Pub. No.: WO02/41010
PCT Pub. Date: May 23, 2002

(65) Prior Publication Data
US 2003/0003781 A1 Jan. 2, 2003

(30) Foreign Application Priority Data
Nov. 17, 2000 (EP) ........................... 00204048

(51) Int. Cl.$^7$ ............................... H01R 9/09
(52) U.S. Cl. .......................... 439/72; 439/73
(58) Field of Search ............... 439/70–73, 331, 439/66, 67, 91, 526; 324/752

(56) References Cited

U.S. PATENT DOCUMENTS 4,593,961 A * 6/1986 Cosmo ........................ 439/66
4,838,799 A * 6/1989 Tonooka ....................... 439/70
5,975,915 A * 11/1999 Yamazaki et al. ............. 439/72
6,012,929 A * 1/2000 Matsumura ................... 439/70
6,609,923 B2 * 8/2003 Sato et al. ................... 439/259

FOREIGN PATENT DOCUMENTS

| JP | 1263572 | 10/1989 |
| JP | 06082519 A | 6/1994 |

* cited by examiner

Primary Examiner—Alexander Gilman
(74) Attorney, Agent, or Firm—Aaron Waxler

(57) ABSTRACT

A socket (1) for accommodating and testing a component (2) having several electrical connectors (3) is disclosed, which socket comprises a substantially rectangular frame (4) surrounding a space (5), which frame (4) includes a first row (6) and a second row (7) of electric conductors (8) which are arranged opposite one another, which conductors (8) have first section (9) with a terminal (10) extending into space (5) for contacting an electric connector (3) of the component (2), and a second section (11) projecting from the frame (4). The spacing (12) between the terminals (10) in each row (6, 7) is adjustable. In the method of testing a component (2) in the socket (1), the spacing (12) between the terminals (10) in each row (6, 7) is adjusted to establish electrical contact between the electrical connectors (3) of the component (2) and its corresponding terminal (10) by placing the component (2) in the socket (1).

13 Claims, 3 Drawing Sheets

SOCKET FOR TESTING A COMPONENT AND METHOD OF TESTING A COMPONENT

The invention relates to a socket for accommodating a component having various electrical connection points during testing said component, said socket comprising an essentially rectangular frame surrounding a space, a first row and a second row of electric conductors being anchored opposite each other in said frame, said conductors having a first section, extending into said space, with an end portion for contacting an electrical connection point of the component to be accommodated, and a second section projecting from the frame, the distances between end portions being adjustable.

The invention also relates to a method of testing a component having various electrical connection points, in which method the component is placed in a socket having an essentially rectangular frame surrounding a space, a first row of electric conductors and a second row of electric conductors being anchored opposite each other in said frame, said conductors having a first section, extending into said space, with an end portion with which an electrical connection point of the component is brought into contact, the distances between end portions being adjustable, and a second section projecting from said frame, which section is electrically connected to measuring equipment.

Such a socket is disclosed in JP-A-1-263572. In the case of the known socket, the distance between the end portions of the first row of electric conductors and the end portions of the second row of electric conductors can be adjusted in steps. To adjust the distances use is made of a bracket that is placed in cavities of the frame. Said cavities are situated at discrete intervals in the frame. Different types of components having different dimensions in a direction perpendicular to the rows of electrical connection points can be electrically measured in the same socket.

A drawback of the known socket resides in that it is incapable of reliably bringing the end portions of the electric conductors into contact with all electrical connection points of a component of a similar type. The rows of electrical connection points of the component exhibit absolute tolerances that are so large that frequently a few electrical connection points of the component do not make contact with the end portions of the electric conductors, as a result of which a good component is wrongly rejected during electrical testing.

It is a first object of the invention to provide a socket of the type described in the opening paragraph, wherein components of a similar type can be electrically tested, in spite of differences in tolerance value.

The invention also aims at providing a method of the type described in the opening paragraph by means of which components of a similar type can be reliably electrically tested.

The first object is achieved in the socket in accordance with the invention in that the spacing between the end portions in each row is adjustable.

Components having various electrical connection points may be, for example, semiconductor devices whose connection points are formed by electrically grown metal tracks or by an envelope. As the spacing between the end portions in each row can be adjusted, the end portions can be adjusted relative to the connection points of the components, thus enabling electrical contact to be established. Components can be electrically measured in the same socket, for example, during different stages in the manufacturing process.

Components comprise electrical connection points having a certain tolerance value, for example typically of the order of a few micron. An increase of the dimensions of components often leads to an increase of the number of electrical connection points and hence to an increase of the absolute tolerance. The tolerance on the connection points of the component can be compensated for as a result of the fact that the spacing between the end portions in each row can be adjusted. The spacing between the end portions can be adapted to the spacing between the electrical connection points of the component. Components of the same type having different tolerance values can be reliably electrically tested. As a result, the erroneous rejection of components on the grounds that no electrical contact is established during electrical testing is precluded.

Favorably, the first sections of each row are connected to one another by an elastic material, and means for stretching the elastic material are present. By stretching the elastic material, the spacing between the end portions is varied continuously. The end portions are equally spaced, or substantially equally spaced, in a row. As the conductors are anchored in a frame and the first sections of the conductors extend in said space, the end portions can move in an accurate manner. The above-mentioned means may be, for example, adjusting screws, which are connected to the elastic material.

Advantageously, the elastic material comprises a polymer, such as an elastomer which is preferably an electrical insulator. The elastomer preferably has a comparatively high resistance to heat.

Advantageously, said space comprises a framework having a first pair of opposite sides of which the elastic material forms part, and having second opposite rigid sides. The framework may have a seating for accommodating a component, which seating serves as the means for stretching the elastic material. Said seating may comprise a number of cams between which the component can be clamped. Upon receiving the component, the cams are forced apart by said component, as a result of which the elastic material is stretched and the framework expanded. The cams of the seating center the component.

Preferably, the frame and the framework have co-operating guide means, enabling the framework to be guided in the case of expansion and contraction. By virtue of the guide means, the framework moves in a plane parallel to the rows of electric conductors.

Advantageously, the frame comprises spring means, as a result of which the framework can be expanded against the spring force in a direction substantially parallel to the first and the second row of electric conductors. The spring means may be, for example, compression springs having preferably a smaller modulus of elasticity than the elastic material. The spring means take up the largest forces that occur when the component is being received or removed. By virtue of the damping effect of the springs, the elastic material is spared and retains its elasticity. After a component has been removed, the spring means cause the framework to return to its starting position.

Preferably, the frame has cams that project in the space, which cams serve as stops for the framework upon contraction thereof. The cams of the frame determine the minimum size of the framework for receiving the component. Without the stop, the elastic material would assume an original state as a result of the spring action, causing the size of the framework to be inadequately defined.

Favorably, the electric conductors contain gold. Gold is a good electric conductor having a low specific resistance. If at least the end portions are made of gold or a gold alloy, they are corrosion-resistant. The end portions of the electric conductors are capable of making satisfactory electrical contact with the connection points, as a result of which a low contact resistance can be achieved.

The object of the invention regarding the method is achieved in that the spacing between the end portions in each row is adjusted by placing the component in the socket in order to bring each one of the electrical connection points of the component into contact with an end portion of its own. The dimensions of the component can be readily and rapidly adjusted. Components of the same type, yet having different tolerance values on the connection points can be tested very rapidly in that, upon placing the component in the socket, the end portions automatically directly contact the relevant connection points.

Advantageously, the first sections of each row are connected to one another by an elastic material, and the elastic material is stretched in order to bring each one of the electrical connection points of the component into contact with an end portion of its own. The elastic material stretches and causes the spacing between the end portions to adapt automatically to the connection points of the component.

Favorably, a framework is present in the space, which framework comprises a first pair of opposite sides of which the elastic material forms part, and it comprises second, opposite rigid sides, which framework also comprises a seating wherein the component is placed, thus causing the elastic material to be stretched.

Favorably, spring means cause the framework to return to a starting position when the component is removed from the seating. The spring means are sufficiently strong to overcome the frictional force between the framework and the guide means upon contraction of the framework. In addition, the spring means have a damping effect if a large force is exerted to receive the component in the socket or to remove the component from the socket.

These and other aspects of the socket in accordance with the invention will be apparent from and elucidated with reference to the embodiment(s) described hereinafter.

Figure 1:
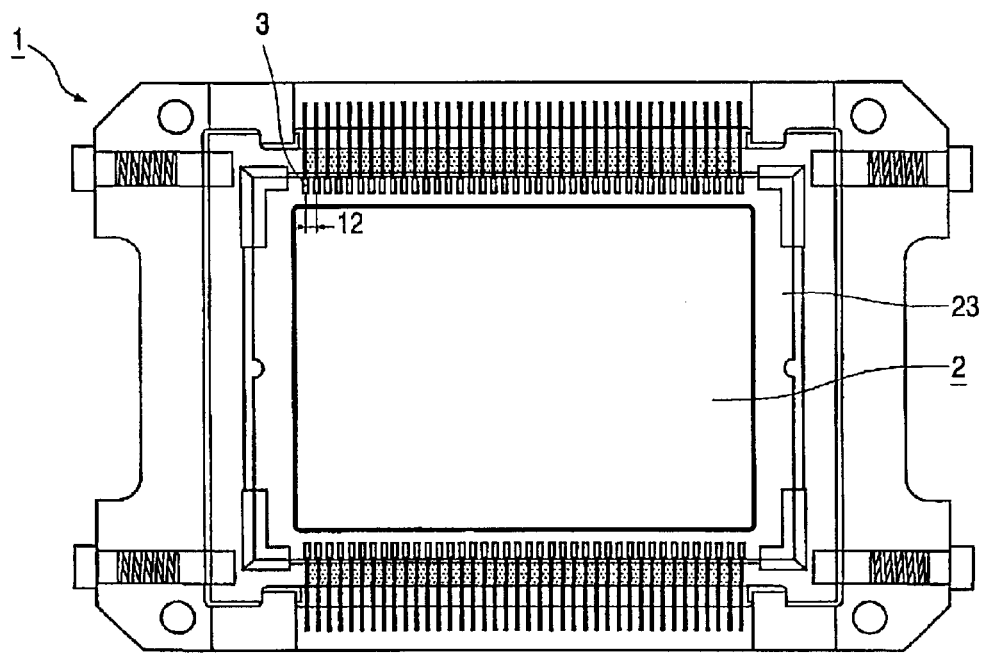
FIG. 1 is a plan view of an embodiment of the socket comprising a component.

The embodiment of the socket 1 shown in FIG. 1 can suitably be used to accommodate a component 2 having various electrical connection points 3, which component 2 is to be tested by means of electrical measuring equipment. In this embodiment, the component 2 is an image sensor in an envelope 23. Said envelope 23 is, for example, a leadless chip carrier or an envelope of the ball grid array-type. The different components exhibit different tolerance values on the connection points 3 of the chip carrier. Typical dimensions of the component 2 in the embodiment shown are of the order of one centimeter. The component 2 has several tens of connection points 3. The spacing 12 between the connection points 3 is typically 100 μm, with a permissible variation of 1%. The absolute tolerance on the outermost connection points of the component 2 is of the order of 100 μm. In the known socket, it is impossible to simultaneously establish electrical contact with the outermost connection points, and reliable electrical testing is impossible. For the sake of clarity, the component 2 is not shown in the other Figures.

Figure 2:
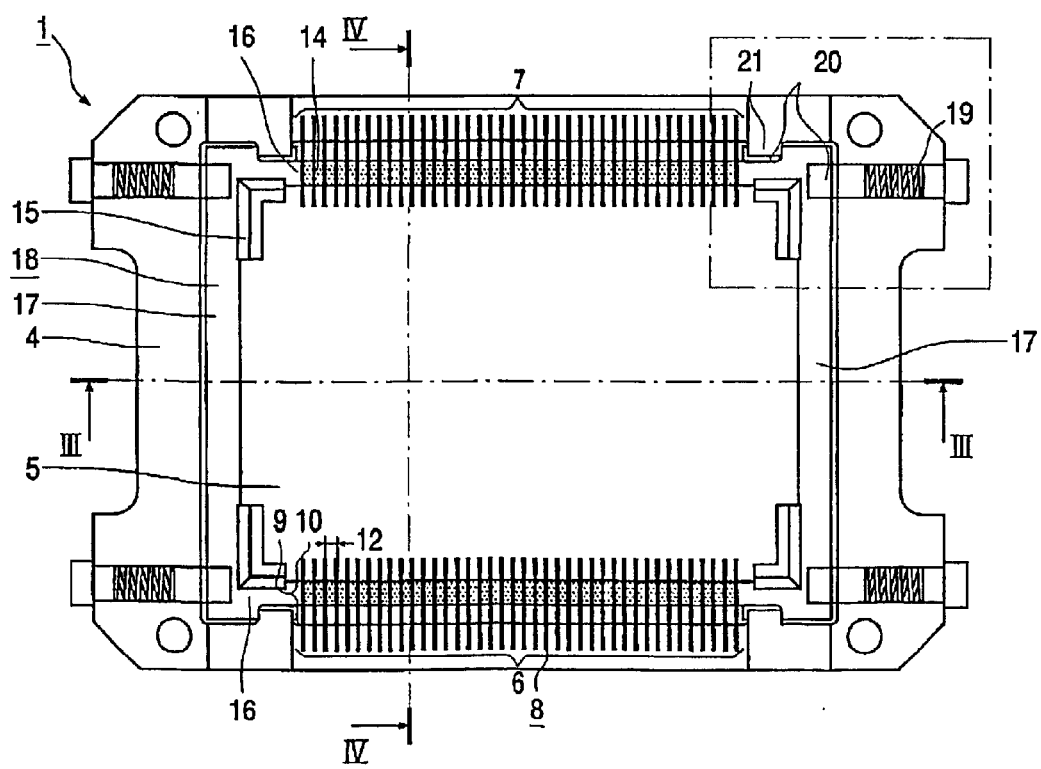
FIG. 2 is a plan view of the same embodiment of the socket without said component.

The socket 1 in accordance with the invention, as shown in FIG. 1 and FIG. 2, comprises an essentially rectangular frame 4 surrounding a space 5. A first row 6 of electric conductors 8 and a second row 7 of electric conductors 8 are anchored opposite each other in the frame 4. The conductors 8 comprise a first section 9, extending into the space 5, having an end portion 10 for contacting an electrical connection point 3 of the component 2 to be received, and a second section 11 projecting from the frame 4. The spacing 12 between the end portions 10 in each row 6, 7 is adjustable. As the spacing 12 is adjustable, the end portions 10 make contact with the connection points 3.

Figure 3:
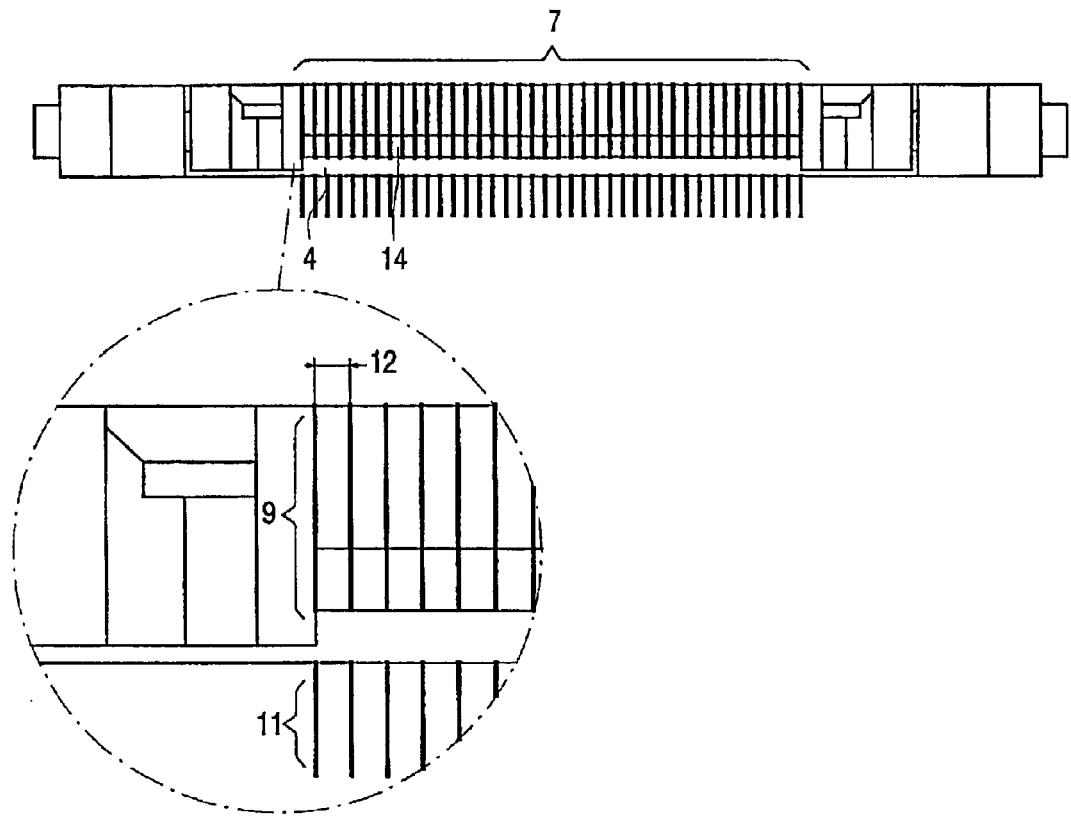
FIG. 3 is a cross-sectional view of the embodiment of the socket taken on the line III—III in FIG. 2.

FIG. 3 is a cross-sectional view of an embodiment of the socket, wherein electric conductors 8 are shown which extend through the frame 4. It is alternatively possible for the conductors 8 to extend along the frame 4. The conductors 8 comprise a second section 11, which projects from the frame 4, and which, in the embodiment shown, is a pin. The pins of the socket can be secured onto, for example, a printed circuit board. The first sections 9 of each row 6, 7 are connected to one another by an elastic material 14. In the cross-sectional view of the embodiment of the socket 1 shown in FIG. 3 and FIG. 4, the electric conductor 8 is entirely enclosed in the elastic material 14. The elastic material 14 may alternatively be situated only between the conductors 8.

The elastic material 14 preferably comprises a polymer, such as the elastomer V-therm manufactured by Chomerics. This elastomer is an electric insulator having a comparatively high heat resistance in the temperature range from −60 to 150° C. Alternatively, other elastic materials, such as rubber or glue, may be used.

Figure 4:
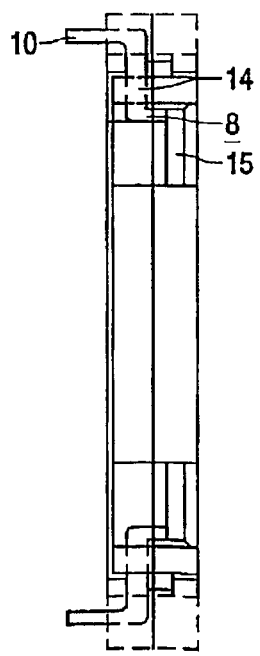
FIG. 4 is a cross-sectional view of the first embodiment of the socket taken on the line IV—IV in FIG. 2.

Means 15 are present to stretch the elastic material 14. FIG. 4 is a cross-sectional view of the first embodiment of the socket with the means 15. The means 15 may be, for example, adjusting screws enabling a force to be exerted to stretch the elastic material 14.

In the embodiment shown in FIG. 2, the space 5 accommodates a framework 18 having a first pair 16 of opposite sides of which the elastic material 14 forms part, and having second, opposite rigid sides 17, said framework 18 comprising a seating for accommodating a component 2, which seating serves as the means 15 for stretching the elastic material 14.

Figure 5A:
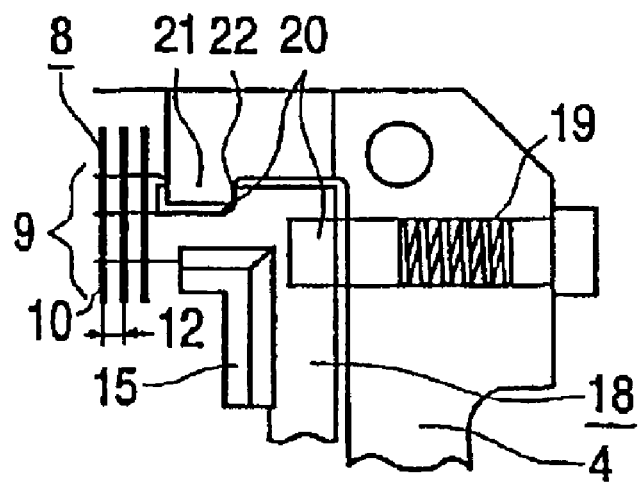
FIG. 5a is a plan view of a detail of the starting position of the socket shown in FIG. 2.

FIG. 5a shows a detail of the embodiment of the socket 1. The frame 4 and the framework 18 have co-operating guide means 20, enabling the framework 18 to be guided upon expansion and contraction. The guide means 20 are, for example, pins inserted partly in the frame 4 and partly in the framework 18. The guide means 20 may be, for example, supports that support the framework 18, so that the framework 18 moves in a plane in a direction parallel to the rows 6, 7 of electric conductors 8. The supports may comprise, for example, a groove or rails allowing the framework 18 to move.

The frame 4 comprises spring means 19 enabling the framework 18 to expand, against the spring force, in a direction substantially parallel to the first and the second row 6, 7 of electric conductors 8. The spring means 19 may be, for example, springs that can be adjusted by means of an adjusting screw before components of the same type are electrically measured. In this embodiment, the spring means 19 are coaxial with the rows 6, 7 of conductors 8 in order to return the elastic material 14 to the starting position.

The frame 4 comprises cams 21 projecting into the space 5, which serve as a stop for the framework 18 upon contraction thereof. The position of the cams 21 determines the minimum size of the seating of the framework 18.

The electric conductors 8 preferably comprise gold. Said gold is often electrically provided on the conductors 8. To obtain a low contact resistance between the connection points of the component and the end portions 10, it is very favorable if at least the end portions 10 of the electric conductors contain a noble metal. Because of the low resistivity of Au, low-impedance contacts can be obtained which are favorable for carrying out electrical tests at high frequencies.

To test a component 2 having various electrical connection points 3, the component 2 is placed in the socket 1. The component can be placed in the socket manually or by means of a robotic arm. An electrical connection point 3 of the component 2 is brought into contact with an end portion 10 of the electric conductors 8, and a second section 11, projecting from the frame 4, is electrically connected to measuring equipment. FIG. 1 is a plan view of an embodiment of the socket 1 accommodating the component 2. In the embodiment shown, the component 2 is an image sensor in an envelope 23. The image sensor in the envelope 23 is electrically tested for, for example, the functioning of the pixels or the value of the dark current at a comparatively high temperature. The socket 1 is placed, for example, on a printed circuit board comprising electronic circuits for testing. The printed circuit board is electrically connected to electrical measuring equipment, such as a parameter analyzer. For the final assembly, the image sensors are often placed in an envelope 23 comprising a ball grid array or a pin grid array as the second sections 11 of the electric conductors 8. By placing the component 2 in the socket 1, the spacing 12 between the end portions 10 in each row 6, 7 is adjusted.

The elastic material 14 is stretched in order to bring each one of the electrical connection points 3 of the component 2 into contact with an end portion 10 of its own.

The elastic material 14 can be stretched by placing the component 2 in the seating 15 of the framework 18. The component 2 is clamped between the cams. If the dimensions of the component are larger than the minimum size of the seating 15 of the framework 18, the elastic material 14 is stretched and the framework 18 becomes larger in a direction parallel to the rows 6, 7 of electric conductors 8.

Figure 5B:
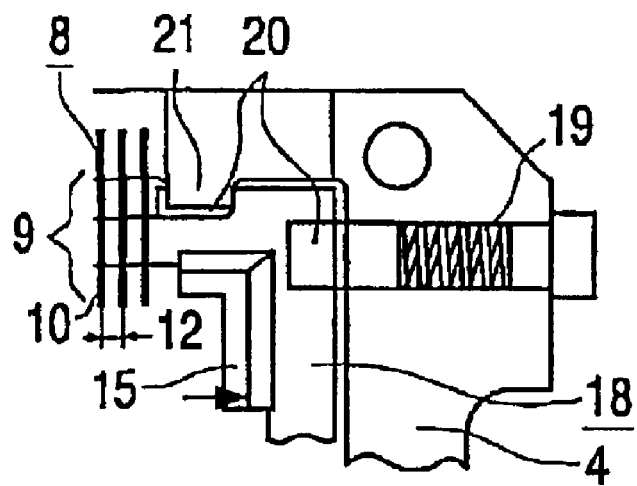
FIG. 5b is a plan view of a detail of the socket, in operation, as shown in FIG. 2.

FIG. 5a shows a detail of the socket 1 in a starting position 22. FIG. 5b shows a detail of the socket 1 in operation. By placing the component 2 in the seating, the framework 18 moves in the direction indicated by means of the arrow. Also the spacing 12 between the end portions 10 increases. After electrically testing the component 2, said component is removed from the seating 15, and spring means 19 return the framework 18 to the starting position 22. The socket 1 is ready for testing the next component.

What is claimed is:

1. A socket for accommodating a component having various electrical connection points during testing said component, said socket comprising an essentially rectangular frame surrounding a space, a first row and a second row of electric conductors being anchored opposite each other in said frame, said conductors having a first section, extending into the space, with an end portion for contacting an electrical connection point of the component to be accommodated, and a second section projecting from the frame, the distances between end portions being adjustable, characterized in that the first sections of each row are connected to one another by elastic material so that the spacing between the end portions in each row is adjustable.

2. A socket as claimed in claim 1, characterized in that the electric conductors contain gold.

3. A socket as claimed in claim 1, further comprising means for stretching the elastic material are present.

4. A socket as claimed in claim 3, characterized in that the elastic material comprises a polymer.

5. A socket as claimed in claim 3, characterized in that the space comprises a framework having a first pair of opposite sides of which the elastic material forms part, and having second opposite rigid sides, which framework has a seating for accommodating a component, which serves as the means for stretching the elastic material.

6. A socket as claimed in claim 5, characterized in that the frame comprises spring means, as a result of which the framework can be expanded against the spring force in a direction substantially parallel to the first and the second row of electric conductors.

7. A socket as claimed in claim 5, characterized in that the frame and the framework have co-operating guide means, enabling the framework to be guided in the case of expansion and contraction.

8. A socket as claimed in claim 7, characterized in that the frame has cams extending in the space, which cams serve as stops for the framework upon contraction thereof.

9. A socket as claimed in claim 7, characterized in that the frame comprises spring means, as a result of which the framework can be expanded against the spring force in a direction substantially parallel to the first and the second row of electric conductors.

10. A method of testing a component having various electrical connection points, in which method the component is placed in a socket having an essentially rectangular frame surrounding a space a row of electric conductors and a second row of electric conductors being anchored opposite each other in said frame, said conductors having a first section, extending into the space, with an end portion with which an electrical connection point of the component is brought into contact, the distances between end portions being adjustable, and a second section projecting from said frame, which section is electrically connected to measuring equipment, characterized in the first sections of each row are connected to one another by elastic material so that the spacing between the end portions in each row is adjustable to bring each one of the electrical connection points of the component into contact with an end portion of their own by placing the component in the socket.

11. A method as claimed in claim 10, characterized in that the elastic material is stretched in order to bring each one of the electrical connection points of the component into contact with an end portion of its own.

12. A method as claimed in claim 11, characterized in that a framework is present in the space, which framework comprises a first pair of opposite sides of which the elastic material forms part, and it comprises second, opposite rigid sides, which framework further composes a seating wherein the component is placed, thus causing the elastic material to be stretched.

13. A method as claimed in claim 12, characterized in that spring means cause the framework to return to a starting position when the component is removed from the seating.

* * * * *